US009160341B2

(12) United States Patent
Eastin

(10) Patent No.: US 9,160,341 B2
(45) Date of Patent: Oct. 13, 2015

(54) EFFICIENT RESOURCE STATE DISTILLATION

(71) Applicant: Bryan K. Eastin, Lafayette, CO (US)

(72) Inventor: Bryan K. Eastin, Lafayette, CO (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 0 days.

(21) Appl. No.: 14/584,693

(22) Filed: Dec. 29, 2014

(65) Prior Publication Data

US 2015/0115998 A1    Apr. 30, 2015

Related U.S. Application Data

(62) Division of application No. 13/765,332, filed on Feb. 12, 2013, now Pat. No. 9,018,971.

(60) Provisional application No. 61/719,063, filed on Oct. 26, 2012.

(51) Int. Cl.
*H03K 19/195* (2006.01)
*G06N 99/00* (2010.01)
*B82Y 10/00* (2011.01)

(52) U.S. Cl.
CPC .............. *H03K 19/195* (2013.01); *B82Y 10/00* (2013.01); *G06N 99/002* (2013.01)

(58) Field of Classification Search
CPC .................................................. H03K 19/195
USPC ........... 326/1, 5, 7; 327/186, 366; 257/31, 34; 714/746
See application file for complete search history.

(56) References Cited

U.S. PATENT DOCUMENTS 8,957,699 B2    2/2015  Eastin
2003/0093451 A1*  5/2003  Chuang et al. ................. 708/520
2014/0365843 A1* 12/2014  Ashikhmin .................... 714/758

OTHER PUBLICATIONS

Aliferis: "*Level Reduction and the Quantum Threshold Theorem*"; Thesis in partial fulfillment of the Requirements for the Degree of Doctor of Philosophy, California Institute of Technology, Dec. 11, 2006, pp. 1-125.
Bravyi et al: "*Magic State Distillation with Low Overhead*", IBM Watson Research Center, Yorktown Heights, NY 10598; Institute for Quantum Information and Matter, California Institute of Technology, Pasadena, CA 91125, Sep. 12, 2012, pp. 1-11.
Bravyi et al 2: "*Universal Quantum Computation with Ideal Clifford Gates and Noisy Ancillas*", The American Physical Society, Physical Review A 71, Feb. 22, 2005, pp. 022316-1 thru 022316-14.

(Continued)

*Primary Examiner* — Daniel D Chang
(74) *Attorney, Agent, or Firm* — Tarolli, Sundheim, Covell & Tummino LLP

(57) ABSTRACT

Systems and methods are provided for generating at least one high fidelity resource state. A classical code and punctured to provide a first set of generators and a second set of generators. The first set of generators is mapped to a set of stabilizer generators, and the second set of generators is mapped to a set of logical operators. A set of resource states are prepared in physical qubits. A decoding process is performed on the resource states according to a quantum code represented by the set of stabilizer generators and the set of logical operators, and qubits corresponding to the stabilizers are measured.

8 Claims, 5 Drawing Sheets

(56) References Cited

OTHER PUBLICATIONS

Fowler et al.: "*High Threshold Universal Quantum Computation on the Surface Code*", Centre for Quantum Computer Technology, University of Melbourne, Victoria, Australia; Institute for Quantum Computing, University of Waterloo, Waterloo, ON, Canada, Dec. 2, 2009 pp. 1-18.

Knill: "*Fault-Tolerant Postselected Quantum Computation: Schemes*", Mathematical and Computational Sciences Division, National Institute of Standards and Technology, Boulder, CO 80305, Feb. 1, 2008, pp. 1-17.

Meier et al.: "*Magic-State Distillation with the Four-Qubit Code*", University of Colorado, Boulder, CO; National Institute of Standards and Technology, Boulder, CO; Northrop Grumman Corporation, Baltimore, MD, Apr. 20, 2012, pp. 1-10.

Raussendorf et al: "*A Fault-Tolerant One-Way Quantum Computer*", Institute for Quantum Information, California Institute of Technology, Pasadena, CA 91125; Los Alamos National Laboratory, Biological and Quantum Physics, MS D454, Los Alamos, NM 87545, Feb. 1, 2008, pp. 1-26.

* cited by examiner

EFFICIENT RESOURCE STATE DISTILLATION

RELATED APPLICATIONS

This application is a divisional application of U.S. patent application Ser. No. 13/765,332, filed 12 Feb. 2013, which claims priority from U.S. Patent Application Ser. No. 61/719,063, filed 26 Oct. 2012, both of which are incorporated herein in their entirety.

TECHNICAL FIELD

This invention relates to quantum computing, and more particularly, to a method of efficient resource state distillation.

BACKGROUND

A classical computer operates by processing bits (binary digits) of information that obey the laws of classical physics. The bits are physically represented by a high or a low energy level, corresponding either to a logical one (e.g., high energy) or a logical zero (e.g., low energy). Transformations on these information bits can be described using simple classical logic gates such as AND and OR gates. A classical algorithm, such as one that multiplies two integers, can be decomposed into a long string of these simple logic gates. Like a classical computer, a quantum computer also has bits and gates. Instead of storing exclusively logical ones and zeroes, a quantum bit ("qubit") can store any quantum mechanical superposition of the two, in some sense allowing a qubit to be in both classical states simultaneously. This ability, coupled with quantum gates that allow the production of such superpositions, enables a quantum computer to solve certain problems with exponentially greater efficiency than that of a classical computer.

SUMMARY OF THE INVENTION

In accordance with an aspect of the present invention, a method is provided for generating at least one high fidelity resource state, where the states are a resource for implementing rotations by some angle $\pi/g$. A classical code is selected in which all of the codewords associated with the code have a weight of zero mod 2g, where g is a positive integer power of two. The classical code is punctured such that a first set of codewords retain a weight of zero mod 2g and a second set of codewords has a weight of 2g−1 mod 2g. The first set of codewords is mapped to a set of stabilizer generators, and the second set of codewords is mapped to a set of logical operators. A set of relatively low fidelity resource states are prepared in a plurality of physical qubits. A decoding process is performed on the set of relatively low fidelity resource states according to a quantum code represented by the set of stabilizer generators and the set of logical operators. Each of the physical qubits corresponding (after decoding) to Z stabilizers are measured and the result is used to determine a correction to be made to the other qubits prior to measuring those corresponding to X stabilizers.

In accordance with another aspect of the present invention, a system is provided for generating at least one high fidelity resource state from a plurality of relatively low fidelity resource states. An encoding circuit encodes a set of logical qubits into a plurality of physical qubits according to a punctured classical code. A rotation component consumes the relatively low fidelity resource state σ to apply a rotation to a state stored in each physical qubit around an axis of the Bloch sphere of $\pi/g$, where g is a positive integer power of two, resulting in a rotation being applied to the logical qubits. A decoding circuit decodes the rotated logical states stored in the physical qubits to provide the set of logical qubits stored in a proper subset of the plurality of physical qubits, at least one of the set of logical qubits comprising a high fidelity resource state.

In accordance with yet another aspect of the present invention, a system is provided for generating at least one high fidelity magic state for a set of Clifford gates. A plurality of physical qubits each store a relatively low fidelity state approximating $|e^{i\pi/4}\rangle$. A decoder includes a first plurality of quantum gates that implement a unitary decoder on the physical qubits corresponding to a quantum code derived from a punctured classical code having a first set of codewords with a weight of zero mod 8 and a second set of codewords with a weight of 7 mod 8. The decoder further includes a first plurality of measurement assemblies for measuring a plurality of physical qubits. A correction component includes a second plurality of quantum gates, each configured to conditionally apply an associated operation to a state stored in one of the unmeasured physical qubits according to the first set of measurement values, and a second set of measurement assemblies to measure at least one of the unmeasured qubits.

DETAILED DESCRIPTION

Figure 1:
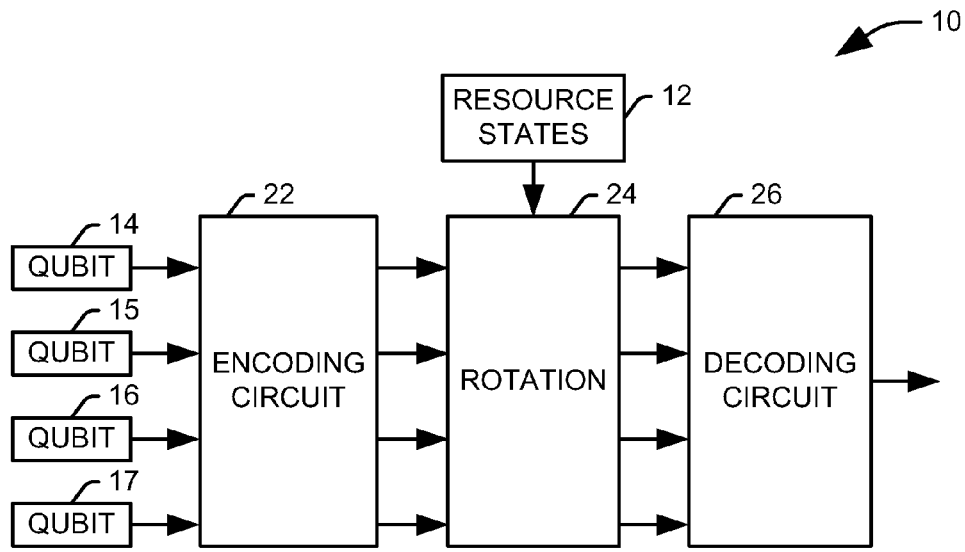
FIG. 1 illustrates one example of a system for generating at least one high fidelity resource state from a plurality of relatively low fidelity resource states in accordance with an aspect of the present invention.

In accordance with an aspect of the present invention, a family of routines is provided to provide distillation of high fidelity resource states from a plurality of relatively low fidelity resource states. Specifically, the systems and methods described herein generate quadratic error suppression with increased efficiency, achieving a state overhead, that is, a ratio of the number of low fidelity input states to the number of improved fidelity output states, that approaches three as the distillation is scaled to larger numbers of input low fidelity states.

A standard basis for qubit states includes a zero state, denoted herein as |0⟩ and a one state, orthogonal to the zero state and denoted herein as |1⟩. A sign basis includes a plus state, |+⟩, defined in the standard basis as $1/\sqrt{2}|0\rangle + 1/\sqrt{2}|1\rangle$, and a minus state, |−⟩, defined in the standard basis as $1/\sqrt{2}|0\rangle -1/\sqrt{2}|1\rangle$. A Y basis includes +1 state, $|Y_+\rangle$, defined in the standard basis as $1/\sqrt{2}|0\rangle +i/\sqrt{2}|1\rangle$, and a −1 state, $|Y_-\rangle$, defined in the standard basis as $1/\sqrt{2}|0\rangle -i/\sqrt{2}|1\rangle$.

A set of universal quantum gates, as the phrase is used herein, is any set of quantum gates to which any operation possible on a quantum computer can be reduced, that is, any other unitary operation can be approximated (to some arbitrary accuracy) as a finite sequence of gates from the set. Conversely, a non-universal set of gates refers to a set of quantum gates that lacks this property. One example of a non-universal set of gates is the set of Clifford gates. The Clifford set of gates, as used herein, is defined to include gates implementing each of the Pauli operators, a controlled not (CNOT) gate, the Hadamard gate, and the $\pi/2$ Z rotation gate, as well as a high-fidelity initialization to the ground state of the standard basis, and measurement assemblies for measuring qubit states in the standard basis, the sign basis, and the Y basis.

A "resource state", as used herein, is a quantum state which can be used with a given set of gates to provide a quantum operation that is not included in that set or even a quantum operation that is not convenient to generate using that set. It will be appreciated that what constitutes a resource state will vary with the given set of gates. A "magic state", as used herein, is a quantum state which can be used with the Clifford set of gates to provide arbitrary quantum operations and can be improved in fidelity by a circuit constructed using gates from the set of Clifford gates. Effectively, the use of a given magic state, or rather, a finite number of instances of the magic state, with the Clifford gates allows for universal quantum computation.

"Distillation", as used herein, refers to the process of probabilistically converting a set of qubits in a given state to produce a smaller set of qubits that assume the given state with higher fidelity. In quantum information theory, fidelity is a measure of the "closeness" of two quantum states. As used herein, fidelity refers to the closeness of a given instance of a state to a desired ideal state. A "low fidelity state" refers to a state that is below the level of fidelity desirable for use in a quantum computation but above a minimum fidelity needed for a distillation process. In accordance with an aspect of the present invention, resource states can be improved to an arbitrary level of fidelity via repeated applications of state distillation.

Classical error correcting codes use a syndrome measurement to diagnose which error corrupts an encoded state. Quantum error correction also employs syndrome measurements by performing a multi-qubit measurement that does not disturb the quantum information in the encoded state but retrieves information about the error. Syndrome measurements can determine whether a qubit has been corrupted, and if so, which one. In fact, the outcome of this operation can indicate not only which physical qubit was affected, but also, in which of several possible ways it was affected. In most codes, errors are projected into either bit flips, or sign (of the phase) flips, or both (corresponding to the Pauli matrices X, Z, and Y). An encoding is used to spread the information associated with a group of qubits, referred to as logical qubits, onto a larger group of physical qubits such that the physical qubits are in an eigenstate of a collection of multi-qubit Pauli operators is referred to herein as a quantum code. A CSS quantum code is a quantum code wherein a basis for the multi-qubit Pauli operators defining the code can be expressed using multi-qubit Pauli operators each of which are composed of only the single qubit Pauli operators X and I or the single qubit Pauli operators Z and I.

FIG. 1 illustrates one example of a system 10 for generating at least one high fidelity resource state from a plurality of relatively low fidelity resource states 12 in accordance with an aspect of the present invention. The system 10 utilizes a CSS quantum code to encode a set of logical qubits onto a larger set of physical qubits 14-17. The code is selected to have the property that an encoded −π/g rotation on each of the logical qubits can be implemented via transversal application of π/g rotations to each of the physical qubits, where g is a positive integer power of two. To this end, each of the physical qubits 14-17 is prepared with a state that can be prepared with high-fidelity via a set of gates not including π/g rotations.

An encoding circuit 22 encodes the set of logical qubits into a plurality of the physical qubits 14-17 according to a punctured classical code having the desired properties. It will be appreciated that a first set of the classical code words can represent stabilizers of the quantum code and a second set of the classical code words can represent the logical operators. Specifically, the inventor has found that a classical code in which each of the code words has a weight of zero mod 2g is suitable for use in applying a transversal rotation of −π/g. Such a code can be selected and appropriately punctured to provide a desired degree of error suppression (e.g., quadratic, cubic, quartic, etc.).

A rotation component 24 applies a rotation to each of the states stored in the physical qubits 14-17 around an axis of the Bloch sphere. Specifically, a rotation of π/g is provided. It will be appreciated that the rotation element 24 will consume the plurality of low fidelity resource states to provide the transverse rotation. In one implementation, the rotation is made around the Z-axis of the Bloch sphere. One example of a quantum circuit that might be used in the rotation component is provided in FIG. 3 below.

A decoder 26 decodes the states stored in the physical qubits 14-17 to provide the set of logical qubits. As part of the decoding process, each of the physical qubits representing (after unitary decoding) one of the stabilizers is measured in a measurement basis. If the measured values associated with the stabilizers are as desired, the remaining qubits are retained as resource states having a fidelity greater than that of the states consumed at the rotation component 24. If one or more of the second set of measurement values do not assume the correct value, the remaining qubits can be corrected or discarded.

Figure 2:
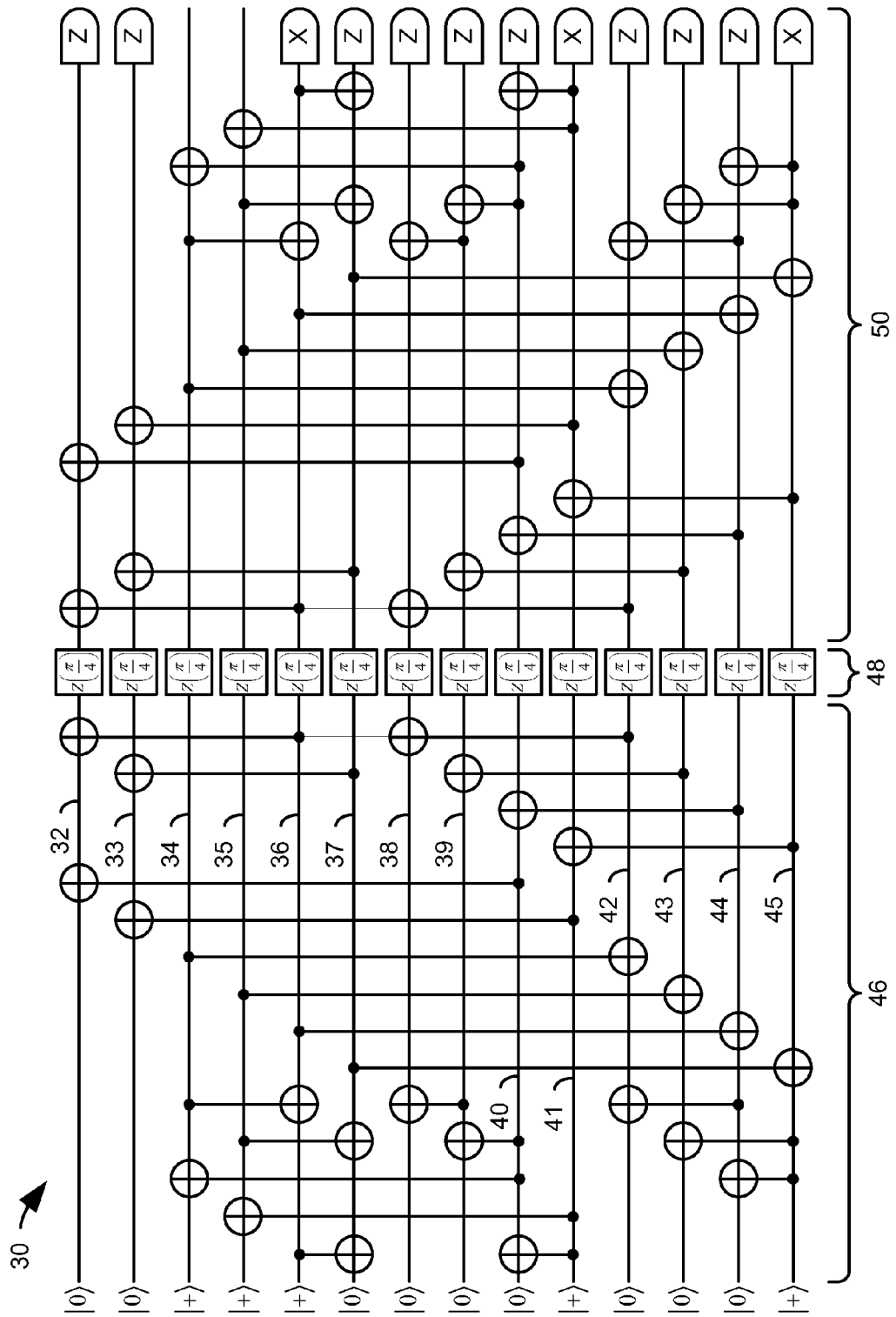
FIG. 2 illustrates one implementation of the system of FIG. 1 as a quantum circuit for performing magic state distillation in accordance with an aspect of the present invention.

FIG. 2 illustrates one implementation of the system of FIG. 1 as a quantum circuit 30 for performing magic state distillation in accordance with an aspect of the present invention. In the illustrated implementation, the magic state is one of a family of states equivalent to the +1 eigenstate of the Hadamard operator. By "equivalent," it is meant that each state can be derived from the others via one-qubit Clifford unitary operators. The specific magic state in this example is the $|e^{i\pi/4}\rangle$ state, represented in the standard basis as $|0\rangle + e^{i\pi/4}|1\rangle$. The quantum circuit uses fourteen qubits 32-45 storing a set of high-fidelity initial states, including five copies of the plus state, stored in physical qubits 34-36, 41, and 45 representing the logical qubits, and nine copies of a zero state, as well as fourteen copies of the $|e^{i\pi/4}\rangle$ state. It will be appreciated that each of the high-fidelity states can be generated either via initialization of a qubit to the ground (zero) state in the standard basis or via a Hadamard gate operation on such an initialized qubit to provide the plus state.

Each of the set of high-fidelity initial states is subjected to an encoding component 46 to encode the fourteen physical qubits represented in the set of initial states with a CCS quantum code having the property that an encoded −π/4 Z-rotation on each of the logical qubits can be implemented via a transversal π/4 Z-rotation across all of the qubits. In general, the CCS quantum code is generated by puncturing a classical code having desired properties and mapping the generators of the codewords within the punctured code to stabilizer generators and logical operators in a quantum code. In this instance, a first set of unpunctured generators can represent X-type stabilizers and a second set of punctured generators can represent X-type logical Pauli operators. In the illustrated implementation, the encoding is performed via a series of controlled NOT (CNOT) gates, although it will be appreciated that the encoding can be performed via any appropriate set of Clifford gates.

In the illustrated implementation, the classical code is selected such that all of the codewords have weight 0 (mod 8). The punctures are arranged such that no generator loses more than a single bit with a value of one and the unpunctured generators span the remaining bits. Distillation can be performed taking the unpunctured generators to be (under a mapping of zero to the identity matrix, I, and one to the Pauli X operator, X) X-type stabilizers and the punctured generators to be X-type logical Pauli operators. It will be appreciated that any other mapping of the codeword to stabilizer generators and logical operators that is equivalent within single qubit Clifford operations can also be utilized. In the example of FIG. 2, the classical code used is a first order Reed-Muller code, with a rate of five and a length of sixteen. A generator matrix for the Reed-Muller code can be represented as:

$$\begin{bmatrix} 1 & 0 & 0 & 1 & 1 & 0 & 0 & 1 & 1 & 0 & 0 & 1 & 1 & 0 & 0 & 1 \\ 0 & 1 & 0 & 1 & 0 & 1 & 0 & 1 & 0 & 1 & 0 & 1 & 0 & 1 & 0 & 1 \\ 0 & 0 & 1 & 1 & 0 & 0 & 1 & 1 & 0 & 0 & 1 & 1 & 0 & 0 & 1 & 1 \\ 0 & 0 & 0 & 0 & 1 & 1 & 1 & 1 & 0 & 0 & 0 & 0 & 1 & 1 & 1 & 1 \\ 0 & 0 & 0 & 0 & 0 & 0 & 0 & 0 & 1 & 1 & 1 & 1 & 1 & 1 & 1 & 1 \end{bmatrix} \quad \text{Eq. 1}$$

In the illustrated implementation, the code is doubly punctured, leaving a generator matrix for the doubly punctured code that can be represented as:

$$\begin{bmatrix} 0 & 1 & 1 & 0 & 0 & 1 & 1 & 0 & 0 & 1 & 1 & 0 & 0 & 1 \\ 0 & 1 & 0 & 1 & 0 & 1 & 0 & 1 & 0 & 1 & 0 & 1 & 0 & 1 \\ 1 & 1 & 0 & 0 & 1 & 1 & 0 & 0 & 1 & 1 & 0 & 0 & 1 & 1 \\ 0 & 0 & 1 & 1 & 1 & 1 & 0 & 0 & 0 & 0 & 1 & 1 & 1 & 1 \\ 0 & 0 & 0 & 0 & 0 & 0 & 1 & 1 & 1 & 1 & 1 & 1 & 1 & 1 \end{bmatrix} \quad \text{Eq. 2}$$

It will be appreciated that, in the punctured code, the first two codewords have had their weights reduced to weight 7 mod 8, while the weights of the last three codewords are unaffected. Accordingly, the stabilizer generators for the quantum circuit can be represented as:

$$\begin{bmatrix} X & X & I & I & X & X & I & I & X & X & I & I & X & X \\ I & I & X & X & X & X & I & I & I & I & X & X & X & X \\ I & I & I & I & I & I & X & X & X & X & X & X & X & X \end{bmatrix} \quad \text{Eq. 3}$$

The X-type logical Pauli operators can be represented as:

$\bar{X}_1$=IXXIIXXIIXXIIXXIIX $\bar{X}_2$=IXIXIXIXIXIXIX  Eq. 4

The effect of the encoding component 46 is to place the qubits storing the high-fidelity initial states into a state comprising a superposition associated with the stabilizer generators and the X-type logical Pauli operators. In accordance with an aspect of the present invention, a rotation component 48 consumes the fourteen prepared low fidelity |eiπ/4⟩ states to apply a rotation transversally across the plurality of qubits. In the circuit of FIG. 2, the rotation is a π/4 Z-rotation.

Figure 3:
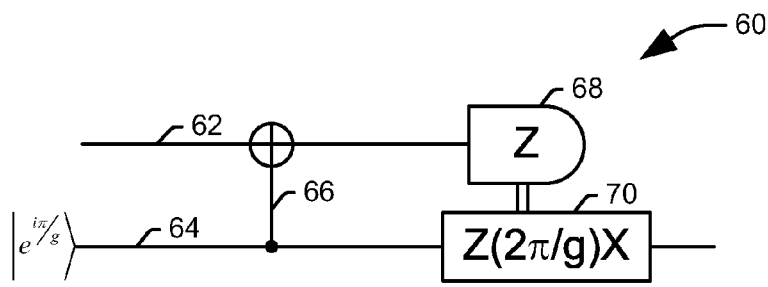
FIG. 3 illustrates one circuit that might be used in the rotation component of FIG. 2 to perform a $\pi/g$ Z rotation using a prepared $|e^{i\pi/g}\rangle$ ancilla state.

It will be appreciated that the π/4 Z rotation of FIG. 2 is simply a special case of a more general class of π/g Z rotations. FIG. 3 illustrates one circuit 60 that might be used in the rotation component 48 of FIG. 2 to perform a π/g Z rotation using a prepared |eiπ/g⟩ ancilla state. The circuit 60 includes a target qubit 62 and an ancilla qubit 64 storing the |eiπ/g⟩ ancilla state. A controlled not (CNOT) gate 66 is performed targeting qubit 62 and controlled by the ancilla qubit 64. The target qubit 62 is then measured at a measurement assembly 68 that measures the target qubit in the standard basis. A rotation component 70 conditionally applies a Z-rotation of 2π/g to the ancilla qubit 64 based upon the measurement of the target qubit. Specifically, the 2π/g Z-rotation, followed by an X gate, is applied only if the target qubit is measured to be in the excited (i.e., "1") state. It will be appreciated that for some values of g (e.g., multiples of four), the rotation component will be a Clifford gate. For others, addition resource states may be necessary to implement the rotation using Clifford gates. After the conditional rotation, the ancilla qubit 64 will be in a state representing the state of the target qubit 62 with a π/g rotation applied.

Returning to FIG. 2, the rotated states are then provided to a decoding component 50 that retrieves the logical qubits from the physical qubits 32-45 comprising the quantum code. In the illustrated implementation, the decoding component 50 utilizes a set of CNOT gates similar to that of the encoding component 46, but implemented in the reverse order. After decoding, each of the physical qubits corresponding to Z-type stabilizers (which in turn correspond to the physical qubits 32, 33, 37-40, and 42-44 that began in the ground state) are measured in the standard (Z) basis. Each of the physical qubits corresponding to X-type stabilizers (which correspond to the physical qubits 36, 41, and 45) are measured in the sign (X) basis. If any of these measured values are not the expected value, it can be assumed that an error occurred in the distillation process, and the states stored in the remaining physical qubits 34 and 35 can be discarded. If all of the measurements provide the expected values, the states stored in the remaining physical qubits 34 and 35 will be resource states having an increased fidelity as compared to the resource states consumed at the rotation element 48.

The inventor has determined that the systems and methods of the present invention are generalizable for distillation routines for |eiπ/g⟩ by using a classical code whose codewords all have weight 0 mod 2g. Direct distillation of |eiπ/g⟩ states for use in π/g Z-rotations may prove to be much more resource efficient than generating π/g Z-rotations using π/4 Z-rotations and Hadamard gates.

The number of input copies of the |eiπ/g⟩ state per each output copy of the |e−iπ/g⟩ state may be regarded as a measure of the efficiency of a resource state distillation routine. By this metric, referred to herein as state overhead, the best existing magic-state distillation routine to achieve a quadratic reduction in the output error probability at the time of the present invention had an overhead of five input states per output state. The example distillation circuits shown in FIGS. 2 and 4 have an overhead of seven input states per output state, but the same technique can be used to approach arbitrarily close to an overhead of three input states per output state.

Figure 4:
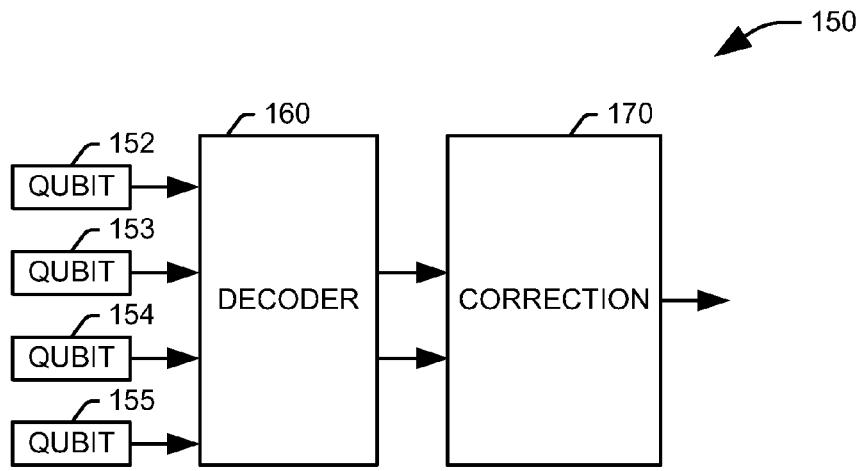
FIG. 4 illustrates another example of a system for generating at least one high fidelity magic state for the set of Clifford gates from a plurality of relatively low fidelity magic states in accordance with an aspect of the present invention.

As general implementation of transversal rotation technique of FIGS. 2 and 4 can be performed by starting with a classical code formed by concatenating an m-bit parity code, where m is a multiple of four, with a four-bit repetition code, and then augmenting the code by the independent generators of the m-bit repetition code concatenated with a four-bit parity code. In other words, the method begins with a classical code whose (m+1)×4m generator matrix has the form:

$$\begin{bmatrix} P & P & P & P \\ 0 & R & 0 & R \\ 0 & 0 & R & R \end{bmatrix} \qquad \text{Eq. 5}$$

where P is a matrix of the generators of an m-bit parity code, R is a vector of m ones, 0 is a vector of m zeros, and m is a multiple of four.

The code is punctured at the first m−2 bits and the punctured generators are used to define logical X operators and the unpunctured ones to define X-type stabilizers. Transversal rotation distillation using such a quantum code yields a quadratic reduction in the error probability at the cost of (4m−(m−2))/(m−2)=(3m+2)/(m−2) input states per output state, which approaches three in the limit of large m. It will be appreciated, however, that the coefficient of the marginal output error rate will increase with increasing m.

Transversal rotation distillation routines can also be derived from classical codes having generators of the form:

$$\begin{bmatrix} D & D \\ 0 & R \end{bmatrix} \qquad \text{Eq. 6}$$

where D is a matrix of the generators of a doubly-even code, R is a vector of k ones, 0 is a vector of k zeros, and k is a multiple of eight.

For example, taking D to be the extended binary Golay code and puncturing ten coordinates gives a transversal rotation distillation routine with quadratic error suppression at a cost of 3.8 (38-to-10) input states per output state. In this specific case, the construction of Eq. 5 gives a superior 38-to-10 routine.

Transversal rotation distillation routines with higher orders of error suppression can also be utilized. One method to achieve stronger error suppression is to puncture only the first term of a 4m-bit classical code, where m is a multiple of four, of the form shown in Eq. 5. When m is equal to four, the corresponding transversal rotation distillation yields a cubic reduction in the error probability at the cost of fifteen input states per output state. Stronger error suppression can be achieved by starting from more complex classical codes, such as the higher order Reed-Muller codes. For example, puncturing the 128-bit second-order Reed-Muller code, RM(2; 7), at bits 1, 2, 3, 5, 9, 17, 33, and 65 (for a standard ordering of bits) gives a 120-to-8 distillation routine with quartic error suppression.

FIG. 4 illustrates another example of a system 150 for generating at least one high fidelity magic state for the set of Clifford gates from a plurality of relatively low fidelity magic states in accordance with an aspect of the present invention. While the number of input magic states expended per output magic state is important, it is not the only quantity relevant to the efficiency of a distillation routine. If we envision magic state distillation as performed using qubits and Clifford gates that have been made highly robust through substantial effort, then the number of locations in a distillation routine affects the error rate that must be achieved in these components such that no error is likely to be observed. Thus, another important quantity is the number of locations in a distillation routine per output state, referred to herein as location overhead. State and location overhead can recommend different routines, particularly when only a round or two of resource-state distillation is required, which is the expected situation for some quantum computing architectures. Consequently, the minimization of location overhead warrants independent consideration.

In the implementation of FIG. 3, it will be noted that the encoder need only prepare the |+⟩ state on each of the logical qubits. For CSS codes, the inventor has determined that encoded state can be prepared by preparing |+⟩ transversally on each of the physical qubits, measuring each of the Z-stabilizers, and then applying correcting X gates as indicated by the measurement outcomes. This encoder is not necessarily more compact than direct encoding, but the measurement and correction can be pushed through to the right side of the transversal physical π/4 Z-rotations. The Z-stabilizer measurements are unchanged by this transformation, but the correcting X gates are transformed into correcting $Z(\pi/2)X$ gates. The initial |+⟩ preparations with the π/4 Z-rotations can be combined into $|e^{i\pi/4}\rangle$ states, and a sequence of circuit identities can be used to push the measurement and correction of the code subspace can be toward the end of the circuit until it directly proceeds the final measurements in the circuit.

At that point, the Z stabilizer measurements are simply measurements on individual qubits, but the correcting unitaries have become a complicated sequence of $Z(\pi/2)$ rotations, controlled Z gates, and X gates. Controlled Z gates acting on a qubit measured in the Z eigenbasis can be replaced by Z gates controlled on the qubit's classical measurement outcome. $Z(\pi/2)$ rotation gates acting on a qubit measured in the Z eigenbasis have no effect and X gates trivially flip the value of the next Z measurement. Consequently, these gates and the final Z measurements can be omitted. In addition, X gates have no effect on the outcome of measurements in the X eigenbasis, so X gates immediately preceding these measurements can also be dropped.

This completes the circuit's transformation to a compacted-transversal-preparation (CTP) distillation circuit, represented by the system 150 of FIG. 4. Specifically, the illustrated system begins with a plurality of physical qubits 152-155 each storing a relatively low fidelity state from a family of states that are equivalent to $|e^{i\pi/4}\rangle$. By "equivalent," it is meant that each state in the family of states can be derived from the $|e^{i\pi/4}\rangle$ state via one-qubit Clifford unitary operators.

The system 150 includes a decoder 160 that applies a decoding process to the low fidelity states stored in the plurality of physical qubits 152-155 according to a selected quantum code. In accordance with an aspect of the present invention, the quantum code is derived from a punctured classical code having a first set of code words with a weight of zero mod eight and a second set of code words with a weight of seven mod eight. It will be appreciated that by "derived from", it is meant that the generators for the quantum code were generated via a standard mapping process (i.e., each 0 bit to an identity operator and each one bit to an X operator) or a Clifford-equivalent mapping process, in which the operators representing each bit can be derived via one-qubit Clifford unitary operators applied to the standard mapping.

The decoder 160 includes a plurality of quantum gates that decode the Z-type stabilizer generators into individual physical qubits. The decoder 160 further includes a plurality of measurement assemblies for measuring the physical qubits corresponding (after decoding) to Z-type stabilizer generators. These measurements can be recorded as a first set of measurement values, for example, on a non-transitory computer readable medium at an associated classical computer. The remaining physical qubits store the X-type stabilizer generators and the logical qubits in a manner determined by the outcomes obtained from measurement of the Z-type stabilizer generators.

A correction component 170 includes a plurality of quantum gates, each configured to conditionally apply an associated operation on the proper subset of physical qubits that remain unmeasured according to the first set of measurement values. By "conditionally apply", it is meant that each rotation gate is applied to associated qubit only if one or more of the first set of measurement values assumes a given value. It will be appreciated that the gates within the correction component can be classically controlled via an associated computer (not shown) and various classical control mechanisms. The effect of the conditional gates is to put a first set of the physical qubits corresponding to the logical qubits in a state that is expected to be, absent error, the desired magic state. A plurality of measurement assemblies are provided to measure a set of the remaining physical qubits, which represent the X-type stabilizers in the quantum code, to provide a second set of measurement values. From the second set of measurements, it can be determined if the system 150 has experienced one of various types of errors. Accordingly, if the second set of measurement values assume corresponding desired values, the remaining qubits are retained as high fidelity magic states. If one or more of the second set of measurement values do not assume the correct value, the remaining qubits can be corrected or discarded.

Figure 5:
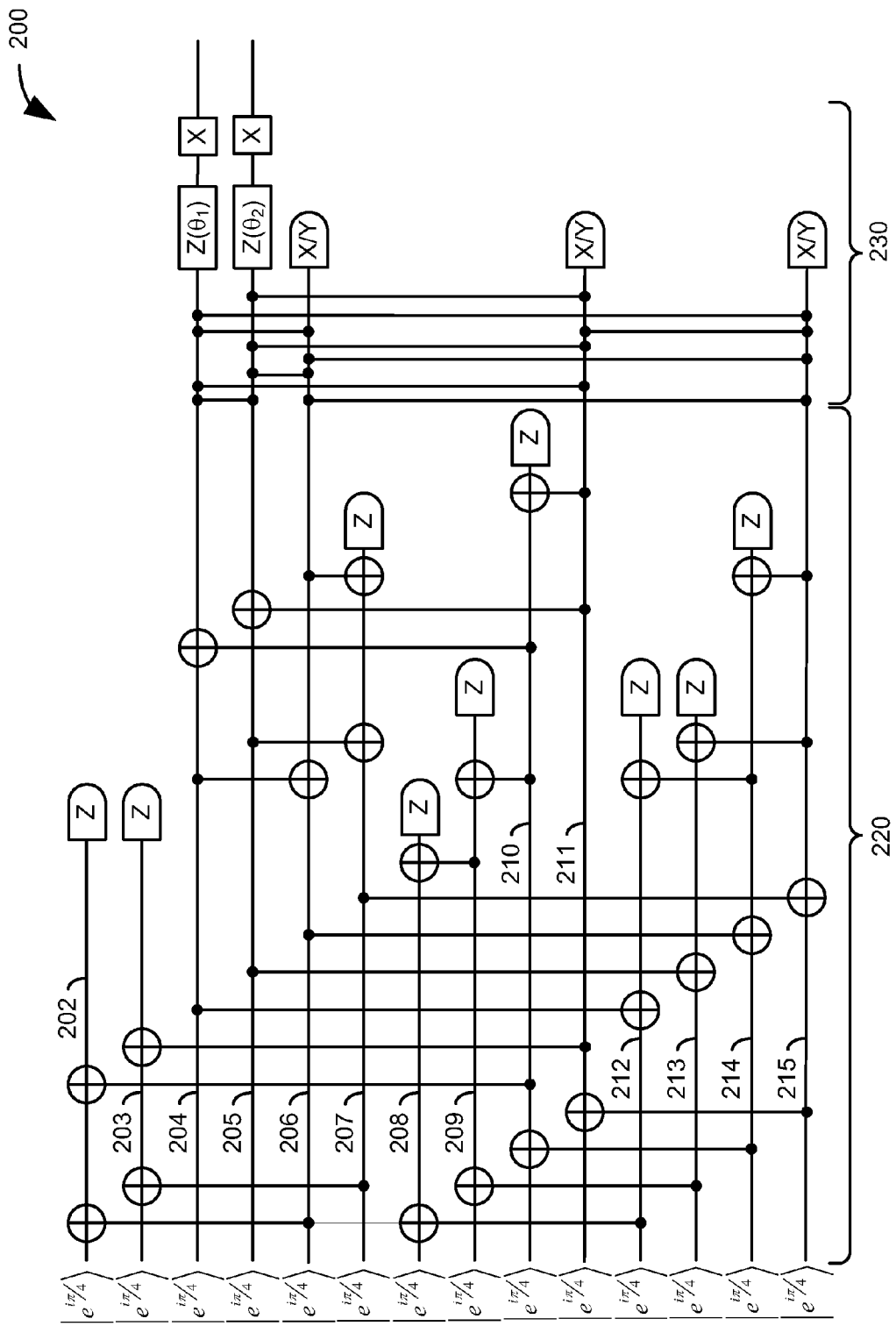
FIG. 5 illustrates one implementation of the system of FIG. 4 as a quantum circuit for performing magic state distillation in accordance with an aspect of the present invention.

FIG. 5 illustrates one implementation of the system of FIG. 4 as a quantum circuit 200 for performing magic state distillation in accordance with an aspect of the present invention. The illustrated quantum circuit 200 includes a plurality of physical qubits 202-215 each prepared in a relatively low fidelity magic state from a family of states equivalent to the +1 Hadamard eigenstate. For brevity, this state is referred herein as the $|e i\pi/4\rangle$ state. A decoding component 220 is applied to decode the Z-type stabilizer generators to individual physical qubits. For the specific application of magic state distillation, the quantum code is based on a punctured classical code selected such that all of the codewords have weight 0 (mod 8), with the punctures are arranged such that no generator loses more than a single bit with a value of one and the unpunctured generators span the remaining bits. In the illustrated decoder 220, a first order, sixteen-bit Reed-Muller code is utilized. As shown in the diagram, the decoder 220 utilizes a series of two qubit gates, in this case, controlled CNOT gates, to decode the prepared states.

The decoder 220 includes a plurality of measurement assemblies and as part of the decoding process, a first set of physical qubits 202, 203, 207-210, 212-214 are measured in the standard (Z) basis. These measurements are recorded as a first set of measurements. The first set of measurements and the remaining qubit states are provided to a correction assembly 230. The correction assembly 230 includes a plurality of quantum gates that are classically controlled according to the first set of measurements to conditionally apply quantum operations to a second set of qubits 204-206, 211, and 215. The plurality of quantum gates can include any appropriate Clifford gate, and in the illustrated example, a series of controlled Z gates are used as well as X gates, and variable Z rotations.

Along with determining whether a given one of the plurality of quantum gates will be utilized, the first set of measurement values are used to determine a specific angle for each Z rotation, as well as whether each of the physical qubits 206, 211, and 215 representing X-type stabilizers of the quantum code will be measured in the sign (X) basis or the Y basis. Regardless of which basis is used, a second set of measurement values derived from these measurements can be compared to an expected set of values. If any of these measured values are not found to be an expected value, it can be assumed that an error occurred in the distillation process, and the states stored in the remaining (unmeasured) physical qubits 204 and 205 can be discarded. If all of the measurements provide the expected values, the states stored in the remaining physical qubits 204 and 205 will be magic states having an increased fidelity as compared to the initial states.

Figure 6:
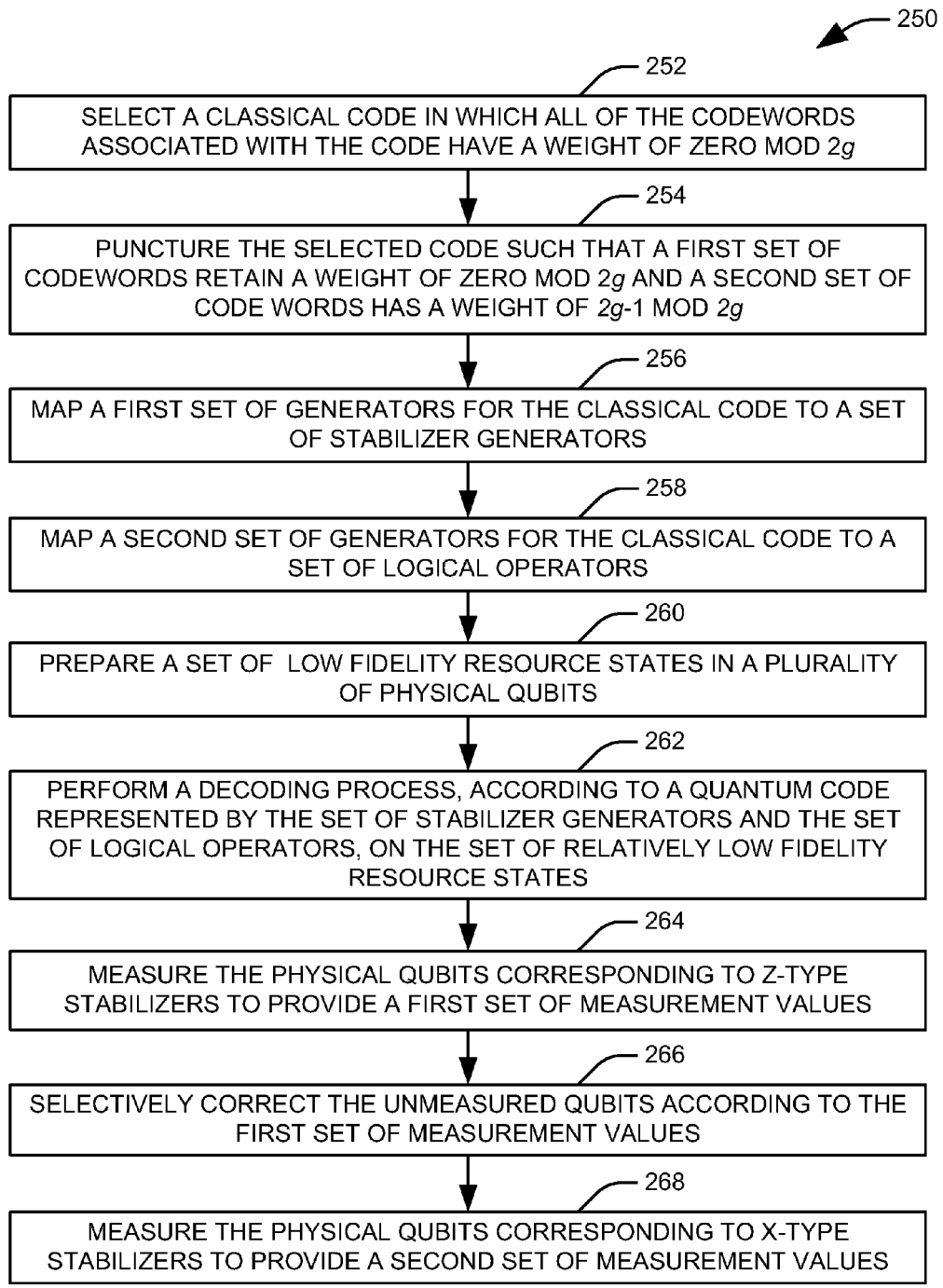
FIG. 6 illustrates a first method for generating at least one high fidelity resource state.
Figure 7:
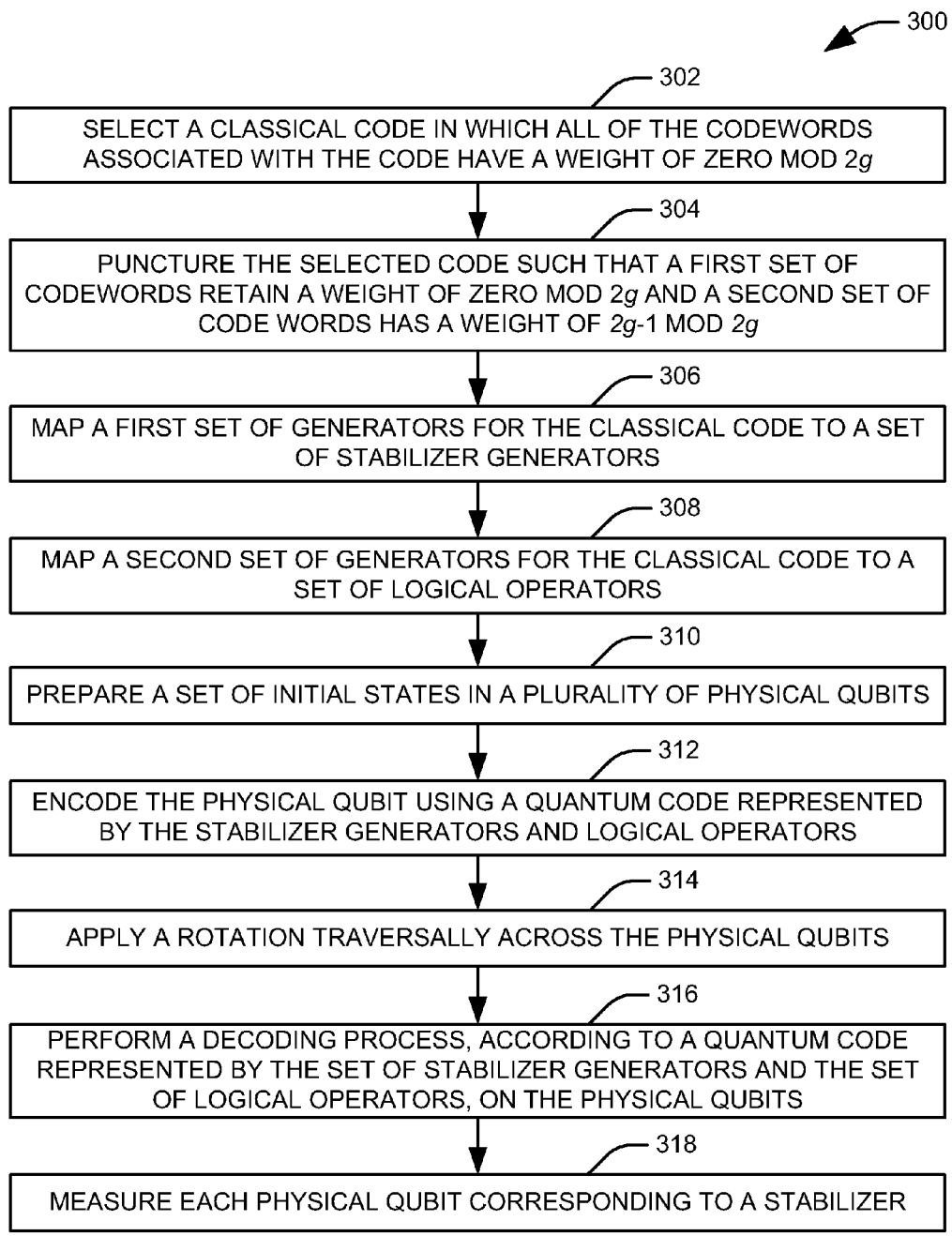
FIG. 7 illustrates a second method for generating at least one high fidelity resource state.

In view of the foregoing structural and functional features described above in FIGS. 1-5, example methodologies will be better appreciated with reference to FIGS. 6 and 7. While, for purposes of simplicity of explanation, the methodologies of FIGS. 6 and 7 are shown and described as executing serially, it is to be understood and appreciated that the present invention is not limited by the illustrated order, as some actions could in other examples occur in different orders and/or concurrently from that shown and described herein.

FIG. 6 illustrates a method 250 for generating at least one high fidelity resource state. At 252, a classical code is selected in which all of the codewords associated with the code have a weight of zero mod 2g, where g is a positive integer power of two. In one implementation, this is a first order, sixteen-bit Reed-Muller code. At 254, the classical code is punctured such that a first set of codewords retain a weight of zero mod 2g and a second set of codewords has a weight of 2g−1 mod 2g. In one implementation, the code is doubly punctured, with the first two bits of each codeword being removed. At 256, the first set of generators (for the classical code) are mapped to a set of stabilizer generators. At 258, the second set of generators to a set of logical operators. In one implementation, binary zeros within the codewords are mapped to an identity operator, and binary ones within the codewords are mapped to Pauli X operators to provide the generators and operators.

At 260, a set of relatively low fidelity resource states are prepared in a plurality of physical qubits. In one implementation, high fidelity initial states are encoded using a quantum code represented by the set of stabilizer generators and the set of logical operators, and a rotation is applied transversally across the physical qubits. In another implementation, each physical qubit is simply prepared in the desired resource state. At 262, a decoding process is performed on the set of relatively low fidelity resource states according to the quantum code represented by the set of stabilizer generators and the set of logical operators. This begins the process of extracting a set of logical qubits from the quantum code. At 264, measurement of the physical qubits corresponding to Z-type stabilizers is performed and at 266 this set of measurement values is used to control selective corrections to the remaining physical qubits. Following any necessary corrections, the unmeasured physical qubits can be divided into a first set corresponding to the logical qubits and a second set corresponding to the X-type stabilizers. At 268, each of the physical qubits in the second set are measured to provide a second set of measurement values. The second set of measurement values enable the detection of errors introduced by the low fidelity states. If all of the second set of measurements assume desired values, the remaining qubits will be expected to contain high fidelity representations of the resource state.

FIG. 7 illustrates a method 300 for generating at least one high fidelity resource state. At 302, a classical code is selected in which all of the codewords associated with the code have a weight of zero mod 2g, where g is a positive integer power of two. In one implementation, this is a first order, sixteen-bit Reed-Muller code. At 304, the classical code is punctured such that a first set of codewords retain a weight of zero mod 2g and a second set of codewords has a weight of 2g−1 mod 2g. In one implementation, the code is doubly punctured, with the first two bits of each codeword being removed. At 306, the first set of generators (for the classical code) are mapped to a set of stabilizer generators. At 308, the second set of generators to a set of logical operators. In one implementation, binary zeros within the codewords are mapped to an identity operator, and binary ones within the codewords are mapped to Pauli X operators to provide the generators and operators.

At 310, a set of physical qubits are prepared in a plurality of initial states. In one implementation, these states can include a plurality of plus states and a plurality of zero states. At 312, the physical qubits are encoded using a quantum code represented by the set of stabilizer generators and the set of logical operators. At 314, a rotation is applied transversally across the physical qubits. At 316, a decoding process is performed on the qubits according to the quantum code represented by the set of stabilizer generators and the set of logical operators. At 318, measurement of the physical qubits corresponding to Z-type stabilizers and X-type stabilizers is performed. If all of the measurements assume desired values, the remaining physical qubits will be expected to store high fidelity representations of the resource state.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A system for generating at least one high fidelity resource state from a plurality of relatively low fidelity resource states, the system comprising:
    an encoding circuit that encodes a set of logical qubits into a plurality of physical qubits according to a punctured classical code;
    a rotation component that consumes the relatively low fidelity resource states to apply a rotation to a state stored in each physical qubit around an axis of the Bloch sphere of $\pi/g$, where g is a positive integer power of two;
    a decoding circuit that decodes the rotated logical states stored in the physical qubits to provide the set of logical qubits stored in a proper subset of the plurality of physical qubits, at least one of the set of logical qubits comprising a high fidelity magic state.

2. The system of claim 1, wherein the encoding circuit comprises a series of two qubit gates configured to place the plurality of physical qubits into a state comprising a superposition associated with a set of stabilizer generators and X-type logical Pauli operators associated with the punctured classical code.

3. The system of claim 2, wherein the decoding circuit comprises the series of two qubit gates performed in a reverse order from that of the encoding circuit.

4. The system of claim 2, in which the series of two qubit gates comprises a series of controlled NOT (CNOT) gates.

5. The system of claim 1, wherein the rotation component, for each physical qubit, comprises:
    a two qubit gate configured to entangle the state stored in the physical qubit with the relatively low fidelity resource state consumed by the rotation, the relatively low fidelity resource state being stored in an ancilla qubit;
    a measurement assembly configured to measure the physical qubit to provide a measurement value; and
    a conditional rotation gate configured to apply a rotation to the state stored in the ancilla qubit around the axis of the Bloch sphere of $2\pi/g$ if the measurement value assumes a desired value, such that the state stored in the ancilla qubit represents the state stored in the physical qubit rotated around the axis of the Bloch sphere by $\pi/g$.

6. A system for generating at least one high fidelity magic state for a set of Clifford gates, the system comprising:
    a plurality of physical qubits each storing a relatively low fidelity state equivalent to $|e^{i\pi/4}\rangle$;
    a decoder comprising:
        a first plurality of quantum gates that decode the states stored in the physical qubits to provide a first strict subset of the plurality of physical qubits corresponding to Z-type stabilizer generators according to a quantum code derived from a punctured classical code having a first set of codewords with a weight of zero mod 8 and a second set of codewords with a weight of 7 mod 8; and
        a first plurality of measurement assemblies for measuring the first subset of the plurality of physical qubits that correspond to Z-type stabilizer generators to provide a first set of measurement values; and
    a correction component comprising:
        a second plurality of quantum gates, each configured to conditionally apply an associated operation to a state stored in at least one physical qubit that is not part of the first subset according to the first set of measurement values; and
        a second set of measurement assemblies for measuring a second strict subset of the plurality of physical qubits that, after correction, correspond to X-type stabilizer generators.

7. The system of claim 6, wherein the first set of measurement assemblies are configured to measure the first subset of the plurality of physical qubits that correspond to Z-type stabilizer generators in the standard basis and the second set of measurement assemblies are configured to measure the second subset of physical qubits that correspond to X-type stabilizer generator in one of the sign basis and the Y-basis.

8. The system of claim 7, wherein the one of the sign basis and the Y basis is selected according to the first set of measurement values.

* * * * *